United States Patent [19]
DuPont et al.

[11] Patent Number: 5,690,796
[45] Date of Patent: Nov. 25, 1997

[54] METHOD AND APPARATUS FOR LAYER DEPOSITIONS

[75] Inventors: Francois DuPont, Thun; Erich Bergmann, Mels, both of Switzerland

[73] Assignee: Balzers Aktiengesellschaft, Furstentum, Liechtenstein

[21] Appl. No.: 567,217

[22] Filed: Dec. 5, 1995

Related U.S. Application Data

[63] Continuation of Ser. No. 290,967, Sep. 9, 1994, abandoned.

[30] Foreign Application Priority Data

Dec. 23, 1992 [CH] Switzerland .................. 3924/92

[51] Int. Cl.$^6$ .................................................. C23C 14/34
[52] U.S. Cl. .................. 204/192.16; 204/192.12; 204/192.13; 204/192.3; 204/192.38; 204/298.03; 204/298.07; 204/298.11; 204/298.23; 204/298.26; 204/298.27; 204/298.28; 204/298.41
[58] Field of Search .................. 204/192.12, 192.13, 204/192.15, 192.16, 192.3, 192.38, 298.03, 298.07, 298.11, 298.23, 298.26, 298.27, 298.28, 298.41; 427/576, 577, 579, 580, 523, 530, 534, 535, 537, 540

[56] References Cited

U.S. PATENT DOCUMENTS

| | | | |
|---|---|---|---|
| 4,346,123 | 8/1982 | Kaufmann | 427/580 |
| 4,851,095 | 7/1989 | Scobey et al. | 204/298.26 |
| 4,877,505 | 10/1989 | Bergmann | 204/192.38 |
| 4,895,631 | 1/1990 | Wirz et al. | 204/192.13 |
| 4,911,784 | 3/1990 | Hensel et al. | 204/192.3 |
| 5,192,578 | 3/1993 | Ramm et al. | 427/576 |

FOREIGN PATENT DOCUMENTS

| | | |
|---|---|---|
| 0282835 | 9/1988 | European Pat. Off. . |
| 0306612 | 3/1989 | European Pat. Off. . |
| 0328257 | 8/1989 | European Pat. Off. . |
| 0432090 | 6/1991 | European Pat. Off. . |
| 3027688 | 4/1981 | Germany . |
| 4115616 | 9/1982 | Germany . |
| 3426795 | 1/1986 | Germany . |
| 3503397 | 8/1986 | Germany . |
| 62-284076 | 12/1987 | Japan . |
| 62284076 | 5/1988 | Japan . |

OTHER PUBLICATIONS

Internat. Search Report for PCT/CH93/00291.

*Primary Examiner*—Nam Nguyen
*Assistant Examiner*—Rodney G. McDonald
*Attorney, Agent, or Firm*—Nataro & Michalos P.C.

[57] ABSTRACT

It is suggested for depositing layers of mechanically resistant material, in particular on highly stressed tools, to coat the workpieces (7) alternatingly by means of reactive cathode sputtering (1, 13) and to after-treat them by means of a further plasma discharge (3).

44 Claims, 4 Drawing Sheets

METHOD AND APPARATUS FOR LAYER DEPOSITIONS

This application is a continuation of application Ser. No. 08/290,967, filed Sep. 9, 1994.

FIELD AND BACKGROUND OF THE INVENTION

The present invention relates to a method according to the preamble of claim 1, a coating apparatus according to that of claim 23, as well as use of said method or said apparatus according to claims 22 or 39, respectively.

It is known to deposit in particular layers comprising mechanically resistant materials, such as layers of carbides and nitrides of titanium and the other metals of group IVb, through ion plating. But in ion plating processes the workpieces to be coated are subjected to relatively strong temperature loading, in particular temperatures over 300° C. Attempts have been made for a long time to develop methods which would permit depositing layers comprising mechanically resistant materials of said type with reactive processes at lower temperatures. For this purpose, in principle the deposition through cathode sputtering would appear to be an option. However, attempts at depositing the above described layers at low temperatures below 300° C. by means of cathode sputtering in such a way that they meet conventional requirements, in particular those made of wear resistance, have been unsuccessful.

For this purpose so-called hybrid methods have become known for example in which a portion of the solid material, is vaporized in an arc discharge in addition to the cathode sputtering as known from EP-A-0 306 612 as well as EP-A-0 432 090 by the same applicant. The power density required for this purpose, however, does not permit reaching the desired low temperature level of below 300° C. without cooling the workpieces. These hybrid methods are technically relatively expensive so that their application in the coating of serially-produced parts is not profitable.

Furthermore, cathode sputtering sources with open magnetic field configurations, so-called "unbalanced magnetrons", have been used for this purpose. The low power efficiency must be viewed as a significant disadvantage of this approach. Only approximately 10% of the input power is used for the sputtering; the remaining 90% is not utilized but enters the cooling water and affecting the costs. In facilities with an open magnetic field configuration more than half of the plasma energy is not used for sputtering the solid material, but rather for generating a plasma in the proximity of the workpiece, which, additionally, creates thermal problems. These methods are therefore rarely used for reactive coating at low temperatures.

It is, furthermore, known to combine various supplemental ionization facilities with cathode sputtering methods. It is known from DE-A-35 03 397 to sputter the solid material for the deposition of mechanically resistant layers by means of a magnetic-field supported cathode sputtering source, a so-called magnetron, to dispose the workpieces in the region of the magnetron and to provide an electron gun behind it. In the region between the workpieces and the magnetron anode rods are provided which draw the electrons introduced by the electron gun into the region of the magnetron plasma discharge. This increases the plasma density in this region.

According to DE-A-35 03 398, a first electrode is provided between the workpieces and the magnetron, and on the other side of the workpieces a second one is provided. The latter is used as an electron emitter in order to increase the plasma density in the region of the magnetron plasma discharge.

Both methods discussed lead to strong heating of the workpieces and can only be used if the workpieces or their cross sectional areas are small relative to the sputtering area of the cathode sputtering source or the magnetron. This was accurately discussed in DE-A-40 11 515.

This restriction forbids the economical use of apparatus of this type. Furthermore, in this arrangement the resulting coating depends on the charging of the apparatus with workpieces, which cannot be used profitably for the conventional application of methods of this type in refining workpieces.

According to DE-A-40 11 515, between the workpieces and the magnetron, an electrode pair is provided, on which an electrode, implemented as a glow cathode, emits electrons. This leads to an increase of the plasma density of the magnetron discharge plasma. Metal or metal-alloy layers are deposited in the process, and not mechanically resistant layers, and the local increase of the plasma density of the sputtering source plasma leads to a relatively high temperature loading of the workpiece.

U.S. Pat. No. 4,389,299 similarly suggests increasing the plasma density of the magnetron plasma by means of thermally emitted electrons.

Reference is made to additional publications of prior art: EP-A-0 328 257, DE-A-35 03 397, DE-A-41 15 616, EP-A-0 282 835 and DE-A-34 26 795.

From EP-A-0 328 257 is known depositing optical layers on optical workpieces in such a way that each layer is applied alternatingly in metal mode and in reactive mode through cathode sputtering. To this end the optical workpieces are alternatingly fed at a relatively high frequency of approximately 50 Hz to said layer-building sources.

Taking into consideration the relatively high clock frequency between reactive mode and metal mode, expensive measures must be taken in order to move the workpieces at a corresponding speed. This is necessary for the reason that it is not possible to use intervals of desirable shortness for separating said two layer modes between the particular sources. It is necessary to insure that in spite of the processing atmosphere of moving workpieces and in spite of gas diffusion processes, locally predominating metal mode and, separately from them, locally predominating reactive mode conditions exist.

SUMMARY OF THE INVENTION

The present invention has the goal of implementing a method of the initially stated type in such a way that, at low temperatures below 300° C., mechanically resistant layers can also be deposited in commercially favorable ways on serially-produced parts and to carry it out in such a way that in terms of stoichiometry, density and adhesion, these layers are at least comparable to layers deposited by ion plating, and no longer exhibit the above stated disadvantages, for example with respect to the approach according to EP-A-0 328 257.

Accordingly, a workpiece surface to be coated is alternatingly exposed to cathode sputtering and to a further plasma discharge which is not significantly participating in the cathode sputtering coating method. The further plasma discharge apparently ensures the homogenation and densification of the surface which had just been coated. Since the plasma density of the cathode sputtering is only insignificantly, if at all, increased through the further plasma discharge, the temperature loading of the workpiece also remains under the required maximum value. In the further plasma discharge an after-treatment proper, of the last applied layer components takes place, not, however, a decisive change of the layer material.

The alternating turning of the surface to be coated, on the one hand, toward the cathode sputtering, and on the other hand, toward the further plasma discharge, is achieved in an extremely simple manner through a pivoting or rotating movement of the workpiece.

For an optimum utilization of the further plasma discharge it is essential, in particular in the case of arcuate surfaces that, facing the further plasma discharge, a tangential plane on the surface to be coated lies essentially in its central region parallel to a tangent on the discharge-path of the further discharge. This allows utilizing a plasma density distribution of said discharge which is essentially uniform along said surface.

The expression "pivoting motion", means a rotational motion of the workpieces about an axis of rotation offset relative to them, and "rotating motion" means a rotational motion of the workpieces themselves.

By implementing the further plasma discharge as a focused discharge, an increased generation of the separation of the spheres of influence of the further plasma discharge and the cathode sputtering is achieved.

In an even more preferred embodiment of the method according to the invention, the layer is essentially deposited through the cathode sputtering as far as the deposited layer material is concerned, including its stoichiometry. The deposited layer material is subsequently after-treated, in particular densified, through the further plasma discharge.

For this purpose preferably, the further plasma discharge is carried out as a discharge in non-reactive gas, such as for example in argon. An absolute separation of the neutral gas atmosphere and the reactive gas atmosphere is not necessary. But the aim is to provide the reactive gas atmosphere essentially in the region of the cathode sputtering source, preferably of a magnetron, and to operate the further plasma discharge, in particular the arc discharge, essentially in a neutral gas atmosphere.

It has been found that with great probability the after-treatment of the deposited layer to achieve the targeted layer properties primarily takes place through ion bombardment with ions of non-reactive gases.

The effect of the further provided plasma discharges is optimized in that the electric potential of the workpieces with respect to the plasma potential of the further discharge is chosen to be negative, preferably less than +10 V, preferably at most +5 V, in particular preferably at most −5 V, and preferably between −5 and −300 V, typically approximately −150 V. This is done, starting from a plasma potential of the further plasma discharge of approximately +20 V relative to ground.

Furthermore, also on the basis of the phenomena just discussed, the rapid alternating exposure of the workpieces to the cathode sputtering, on the one hand, and to the further plasma discharge, on the other hand, is not necessary. Therefore, with a preferred embodiment of the method according to the invention, these alternating frequencies can be at most 30 Hz, preferably at most 10 Hz, preferably even below 1 Hz, typically approximately 0.1 Hz. In this way a substantial reduction of the constructional expenditure for the workpiece mounting and the workpiece driving is achieved, realizing substantially slower alternating motions between cathode sputtering and the further plasma discharge path.

By adjusting the focusing, the plasma density to which the workpiece surface facing the further discharge is exposed, can be optimized, on the one hand, for the after-treatment process, but can, on the other hand, be adjusted for other process stages, for example for heating or etching.

For the purpose just stated, the electric potential on the workpiece is preferably implemented so as to be adjustable so that different surface treatment processes and after-treatment processes can be carried out and optimized.

An optimum stabilization of the reactive cathode sputtering process is achieved even at operating points which would be unstable without the provision of a regulation of this type, i.e. at which the sputtered surface of the cathode sputtering source would be poisoned in a known manner.

Preferred embodiments of the reactive gas feed, on the one hand, or said regulation, on the other hand, when two and more cathode sputtering sources are provided.

The fact that, the workpiece can be shielded against the cathode sputtering makes it possible, as has already been stated but to an increased degree, to treat the workpiece surface selectively, for example to etch it, with the further plasma discharge alone. In such a process step for example preceding the layer deposition, only an inert gas, such as argon can be introduced as the working gas. Due to the shielding, the cathode sputtering source can simultaneously also be sputtered free. It is known that in the process the surface of the cathode sputtering sources, from which subsequently the dust is removed for the layer deposition, can be cleaned, for example of oxidic layers, formed in normal atmosphere.

By changing the further plasma discharge at the site of the workpiece surface facing it and/or by changing the electric potential on the workpiece said surface can also be etched or heated. The plasma density can be changed for example by increasing the discharge current and/or by changing the plasma focusing.

But in particular also by selecting the plasma density of the further plasma discharge in the region of the workpiece surface which, as has been-stated, can take place by controlling the focusing of the further plasma discharge and/or its performance, as well as by selecting the electric potential at the workpiece, temperatures on the workpiece below 300° C. are achieved. In the process, in particular a mechanically resistant layer is nevertheless deposited which at least approximately and with respect to the properties required for layers of this type, for example with respect to wear-and-tear, are comparable to layers deposited in ion plating processes.

BRIEF DESCRIPTION OF THE DRAWINGS

In the following the invention will be explained by example with reference to the Figures. They depict.

DESCRIPTION OF THE PREFERRED EMBODIMENT

Figure 1:
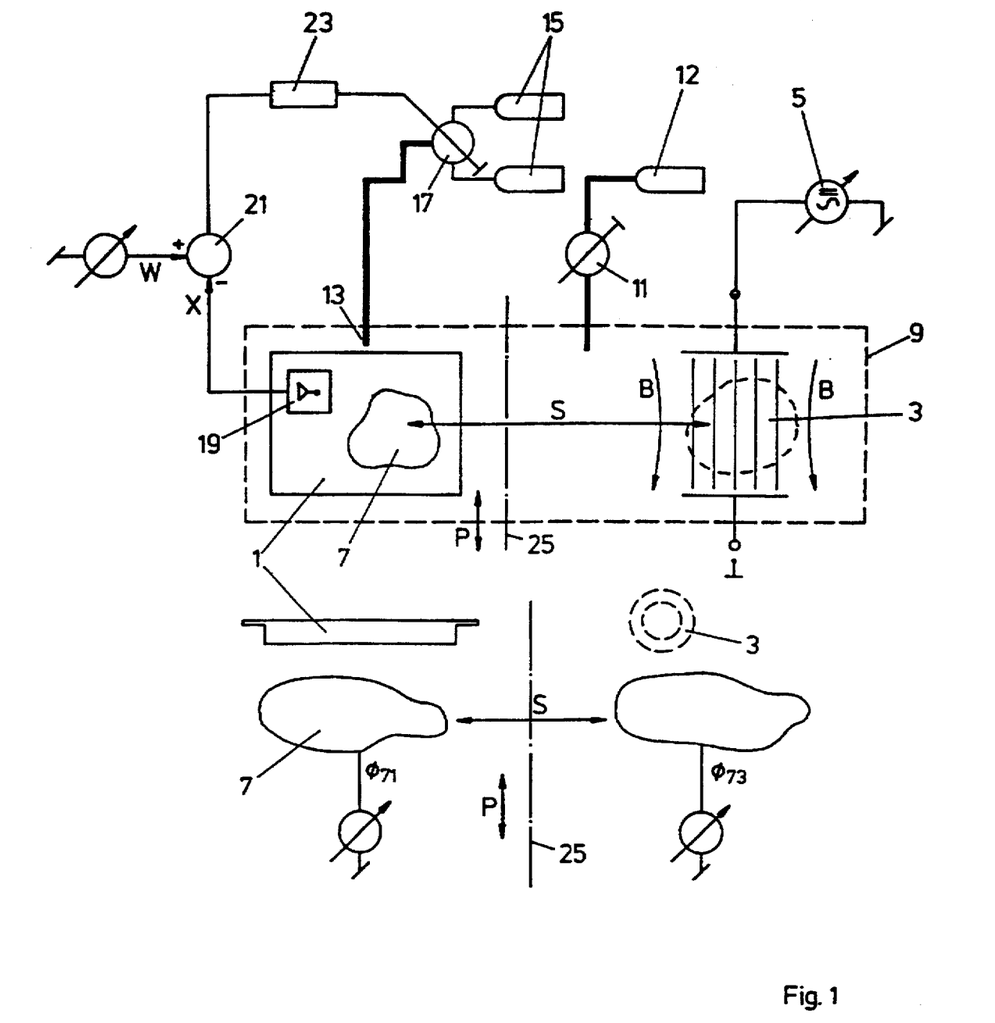
FIG. 1 shows schematically, in the form of a fundamental process flow, the principle of the method according to the invention with preferred realizations or the principle of a coating apparatus according to the invention in side and top views.

In FIG. 1 which represents schematically and basically the approach according to the invention, numeral 1 denotes the sputtered surface of a cathode sputtering source, such as in particular a magnetron source, i.e. the target.

Offset from the cathode sputtering source 1, a further plasma discharge path 3 is provided, as depicted schematically with source 5, which is DC operated, AC operated up into the microwave range or operated with DC and superimposed AC in the most generally considered way. Although in FIG. 1 the further plasma discharge is depicted as being generated between two electrodes, i.e. capacitively, this further plasma discharge can in the most general case under consideration here, be generated in any manner known.

A workpiece 7 is exposed according to the invention with its surface to be coated alternatingly to the cathode sputtering source 1 and the additionally provided plasma discharge on path 3. This is depicted schematically in FIG. 1 with the double arrow S.

In FIG. 1, the dashed lines indicate a vacuum receptacle 9.

Into the receptacle 9 is introduced from a tank 12 via a control valve 11, a gas to be ionized, such as argon. Furthermore, a reactive gas or a reactive gas mixture is introduced, such as with a gas port arrangement 13, preferably into the region of the cathode sputtering source 1, from a tank arrangement 15, controlled or adjusted by a valve arrangement 17. Consequently, the reactive coating process predominantly takes place in the region of the cathode sputtering source 1. In the region of the further plasma discharge path 3 the deposited layer is "refined".

In preferred realizations the cathode sputtering process is regulated. As a sensor for the measured regulating variable X the sensing head of a plasma emission monitor is used, disposed specifically directly in the region of the cathode sputtering source 1. Its output signal is evaluated (not depicted) in the plasma emission monitor and compared in a difference unit 21 with a control signal W. As the manipulated variable preferably the mass stream of the reactive gas or its mixture ratio supplied to the receptacle 9 is acted upon by means of the valve arrangement 17. This takes place potentially via a regulator 23.

But the cathode sputtering process can also be regulated in different ways, for example by measuring the sputtering rate by means of electrical probes or by means of a quartz layer thickness measuring instrument as the sensing device for the measured regulating variable. Alternatively, or also additionally, to the adjustment intervention of the reactive gas, the electric operating voltage at the sputtering source can also be affected, in particular also the magnetic field generation of a magnetron source.

In FIG. 1, a shielding device 25 is depicted in dot-dash line, such as a controllable diaphragm, by means of which in the receptacle 9 a spatial region with the cathode sputtering source 1 can be shielded in a controlled way from a spatial region with the further plasma discharge path 3. This is implemented in a preferred embodiment of the invention.

Figure 3:
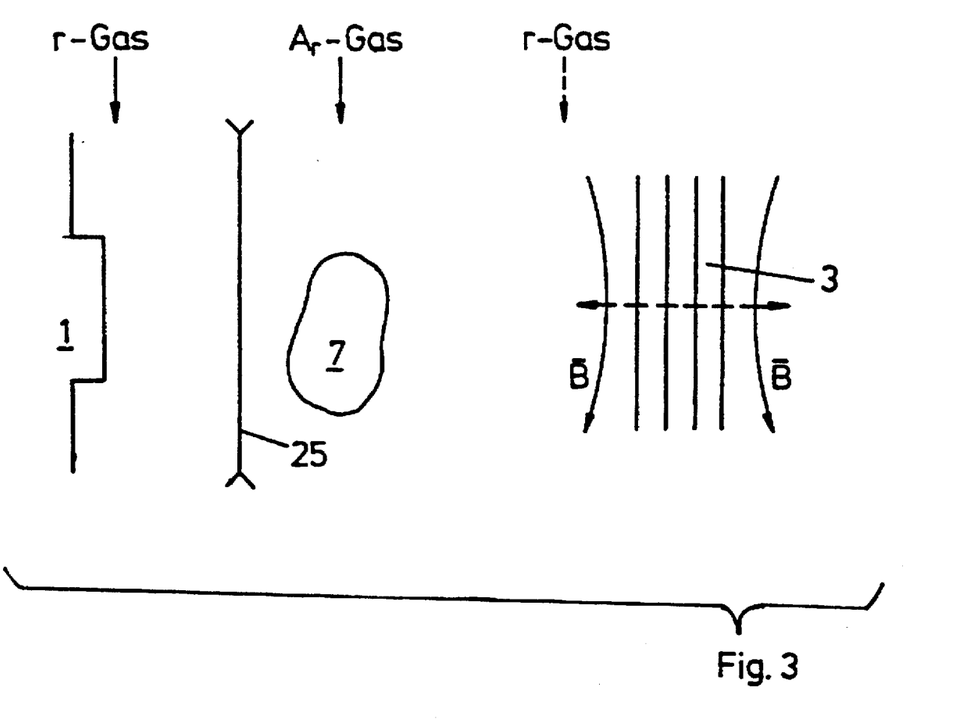
FIG. 3 is a basic representation of the cathode sputtering region and the region of the further plasma discharge with respect to a workpiece, and the different process phases in the approach according to FIG. 1 or 2, realized through the controlled shielding of the workpiece with respect to cathode sputtering.

If, according to FIG. 3 the workpiece 7 is positioned in the region of the further plasma discharge 3, the shielding 25 can be closed and the cathode sputtering source 1, preferably a magnetron, can be sputtered free. When the workpiece surface 7 is exposed to the further plasma discharge 3 it can simultaneously be etched or heated or its surface can basically be plasma-treated. For this purpose the performance, for example the discharge current, of the further plasma discharge path is adjusted by means of the source 5 of FIG. 1. It is also possible to set specifically alternatively or additionally, the plasma density at the surface region of the workpiece 7 facing the discharge 3 by means of magnetic fields B, in the sense of a controlled focusing and, consequently controlled power density distribution of the further plasma discharge 3.

For the further control of the treatment process realized at said surface, as depicted schematically in FIG. 1, the electrical potential $\phi_7$ on the workpiece 7 is specifically set which, as is known to one skilled in the art, the ion bombardment density and the ion bombardment intensity on the workpiece 7 is set. $\phi_{73}$ is preferably selected to be more negative than the plasma potential of the further plasma discharge 3, preferably lower than +10 V, preferably at most +5 V, in particular at most −5 V, preferably between −5 V and −300 V, typically approximately −150 V.

As depicted in particular in FIG. 3, the inert gas, such as for example argon, is supplied to the receptacle volume in such a way that it is distributed a homogeneously as possible in said volume, while the reaction gas r is introduced primarily into the immediate region of the cathode sputtering source 1. But, as is shown in dashed lines in FIG. 3, a reactive gas can also be introduced through nozzles specifically into the region of the further plasma discharge 3 if, with the shielding 25 prefereably closed, a reactive process is to take place there.

As is apparent, according to the invention the workpiece surface to be coated is alternatingly exposed to the cathode sputtering source with its target surface 1 or to the further plasma discharge 3, as shown in schematic top view at the bottom of FIG. 1. It is entirely possible to choose the electric workpiece potential $\phi_7$ in the region of the cathode sputtering source $\phi_{71}$ so that it differs from that in the region of the further plasma discharge, denoted there by $\phi_{73}$.

Figure 2:
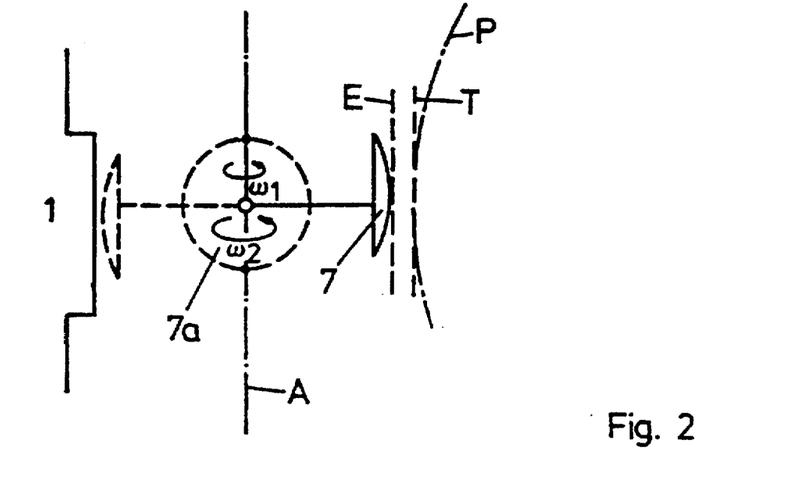
FIG. 2 shows schematically the preferred approach for transferring a subject workpiece surface from a cathode sputtering phase to a further plasma treatment phase according to FIG. 1 or the preferred approach realized in an apparatus according to the invention.

The alternating exposure of the surface to be coated of the workpiece 7 is realized according to FIG. 2 in preferred manner through a pivoting motion or a rotating motion. The workpiece 7 is for this purpose either pivoted about a pivot axis A in such a way that its surface to be coated alternatingly faces the sputtering source 1 and the discharge path P of the further plasma discharge, depicted by $\omega_2$. The workpiece 7a can also be rotated about an internal workpiece axis A, $\omega_1$, for example a disk-shaped workpiece both of whose surfaces are to be coated. As alternating frequencies, low frequencies are useful, which leads to significant simplifications. The preferably used frequencies are maximally 30 Hz, preferably lower than 10 Hz, further preferably maximally 1 Hz, and typically even approximately 0.1 Hz.

In the case of an arcuate surface to be coated a tangential plane E should be positioned on this surface in its central region, essentially parallel to a tangent T on the discharge path P of the further plasma discharge, in order to ensure the at least approximately uniform distribution of the plasma density on the surface.

Figure 4:
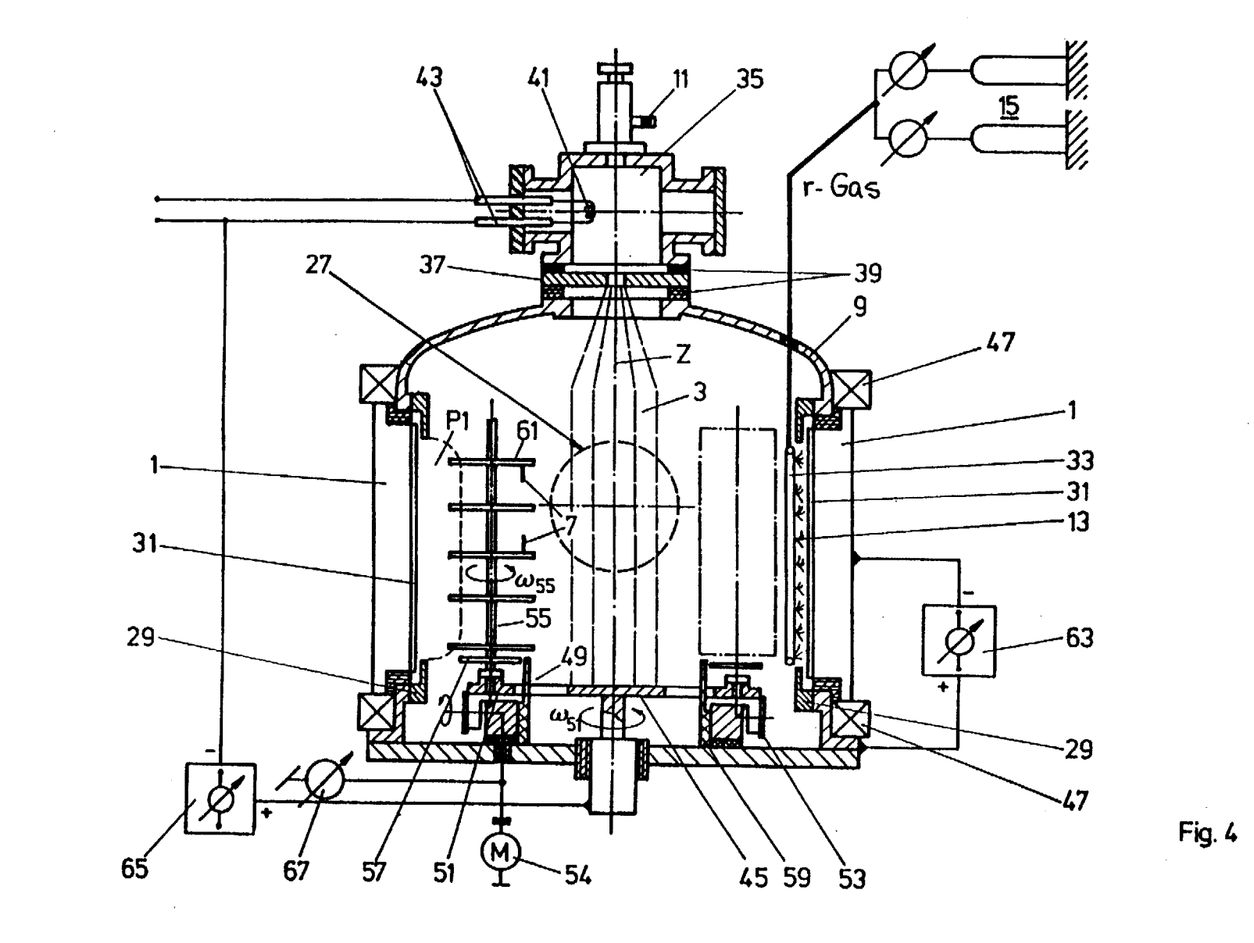
FIG. 4 is a schematic longitudinal section through a treatment apparatus according to the invention.

FIG. 4 schematically depicts an apparatus according to the invention in longitudinal section. For the function units and parameters which have already been described in principle in conjunction with FIGS. 1 to 3, the same reference symbols are used.

Two or more cathode sputtering sources 1 are mounted on the jacket of a vacuum receptable 9, which is essentially constructed cylindrically about a central axis Z, with an evacuation connection 27 for a vacuum pump. The sources 1 are electrically insulated from the jacket. They are preferably magnetic-field enhanced sputtering sources, such as are generally known by the term magnetron sources. As is also known, they are encompassed by anode rings 29 and comprise one target plate 31 each, of the solid material to be sputtered.

As is known to the expert and not depicted here, at the preferably used magnetron sputtering sources, tunnel-shaped magnetic fields are generated statically or moving over the target surface to be sputtered. This significantly increases the plasma density, schematically at $PL_1$, of the cathode sputtering sources plasmas. Directly in the region of the target surface to be sputtered, the gas inlet arrangement 13 is provided for the reactive gas r which, for reasons of clarity, is only entered at the right magnetron of the magnetrons 1 depicted in FIG. 4. It is preferably formed by at least one tubing loop 33 which encircles the target periphery, with exit bores facing the target surface for the gas. Through these bores, preferably essentially at an angle of 45°, the reactive gas is introduced to the surface of the target 31, through nozzles.

An ionization chamber 35 is provided coaxially with the center axis Z, which communicates via a diaphragm 37 with the inner volume of the receptable 9. The diaphragm 37 is preferably electrically insulated by insulation 39 with respect to the wall of the receptacle 9, as well as also with respect to the wall of the ionization chamber 35. Also electrically insulated, a hot cathode 41 is provided with heating current terminals 43 as an electron emission cathode in the ionization chamber 35. Coaxially with said axis Z, an anode 45 opposing the diaphragm 37 is mounted in the receptacle 9 so as to be insulated with respect to the wall of receptacle 9. A low-voltage plasma arc discharge is generated in known manner through the diaphragm 37 between ionization chamber 35 and anode 45 as the further plasma discharge 3 in the form of a plasma beam.

Further details for generating a low-voltage arc vaporization path are discussed, for example, in Swiss Patent No. 631 743.

A further gas inlet 11 for a gas to be ionized, such as argon, is provided on the ionization chamber 35. Coaxially with axis Z are, moreover, provided one or several coils 47 by means of which an essentially axial magnetic field is generated in the receptacle 9. By changing the magnetic field coupling through the coil 47, the focusing of the plasma beam of the further discharge 3 is adjusted.

About the anode 45, a carrier arrangement 49 for workpieces is provided. It comprises a carrier ring 51 which rolls on rollers 53 and, consequently, circulates about the center axis Z. As depicted schematically with motor 54, least one of the rollers 53 distributed at the circumference of the ring 51, is driven. On the ring 51 a multiplicity of rotary stands 55 projecting up in parallel with axis Z, are rotatably supported so as to be electrically insulated. A driving roller 57 for purpose engages a stationarily mounted cylinder segment 59 on the wall of receptacle 9 and projecting upward coaxially with axis Z. Consequently, the rotary stands 55 rotate about their own axis, as represented by $\omega_{55}$, and simultaneously with the ring 51 about the central axis Z, as represented by $\omega_{51}$.

The rotary stands 55 are constructed like a tree, each having a multiplicity of projecting carriers 61 on which workpieces 7 are mounted either suspended or standing upright. Consequently, the workpieces 7 are pivoted alternatingly through the rotational motion $\omega_{55}$ into the region of the particular cathode sputtering sources 1 and into the region of the further plasma discharge 3. They are simultaneously moved through the rotational motion $\omega_{51}$ from one cathode sputtering source 1 to the next. Moreover, 65 and 63 denote electric sources for operating the cathode sputtering sources 1 or for applying a potential to the electron emission cathode 41, with respect to the anode 45.

Furthermore, an adjustable source 67 is provided by means of which, for example via the drive shaft of motor 54, rollers 53, ring 51, rotary stands 55, the electric potential on the workpieces 7 is adjusted.

Figure 5:
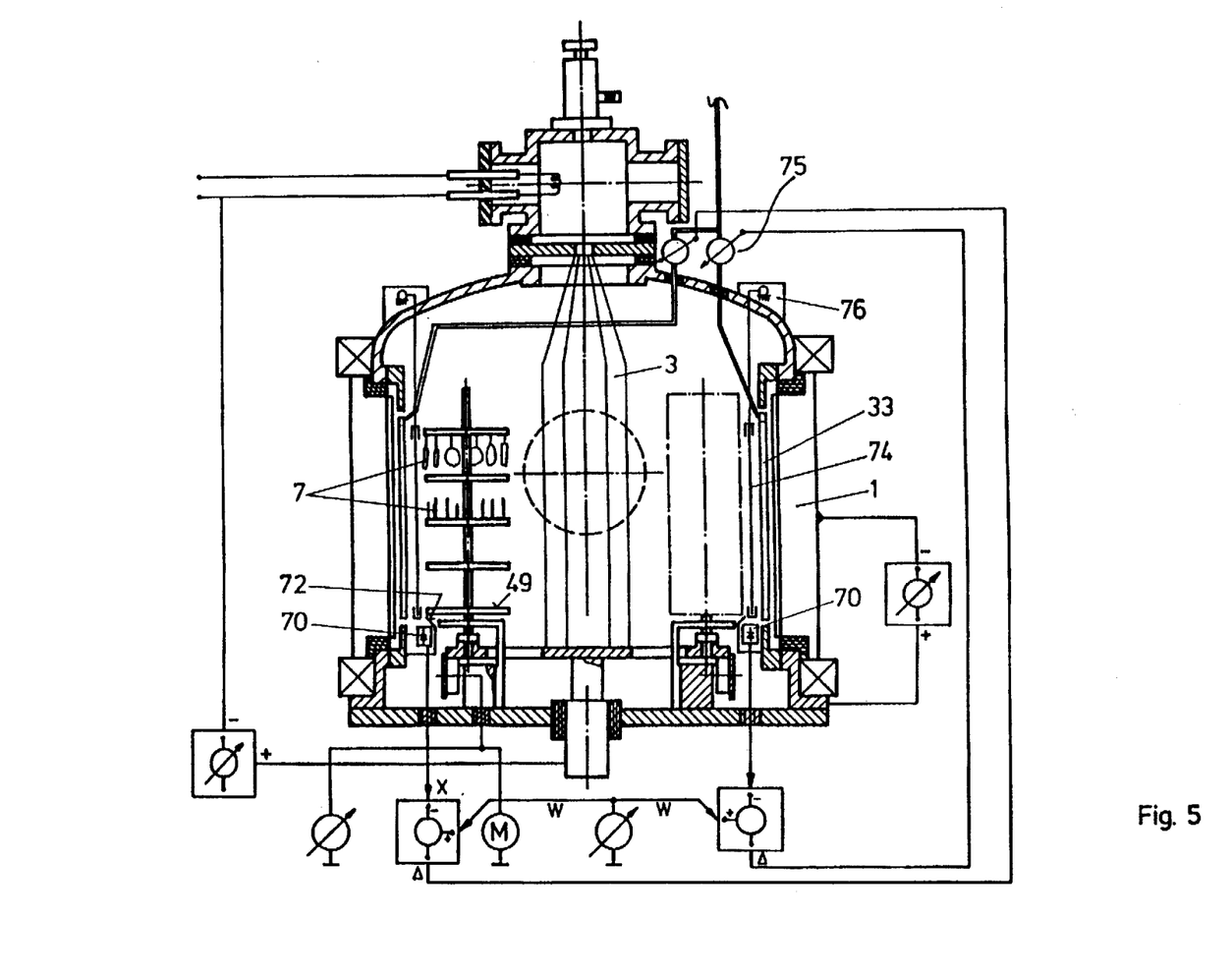
FIG. 5 shows the apparatus according to FIG. 4, with measures preferably provided additionally.

The apparatus according to FIG. 4 is depicted again in FIG. 5. But here further preferred measures are depicted which, for reasons of clarity, are not shown in the representation of FIG. 4. A pick-up sensor 70 is assigned to each cathode sputtering source 1, preferably a sensing head of a plasma emission monitor. As schematically shown at 72, it is shielded against the radiation of the further plasma discharge 3 by means of an appropriately formed and disposed shielding. After the appropriate evaluation, the output signal of each pickup sensor is compared with a given NOMINAL or reference value, according to FIG. 5 the same value W, formed in the reactive gas feed through controllable valves. The result of the comparison is supplied as the regulating difference Δ to a final control element, preferably a final control element 74, assigned to the cathode sputtering sources 1.

Consequently, the coating process is preferably regulated at each cathode sputtering source 1 individually, which makes possible, in particular in the workpiece coating with layers which are electrically poorly insulated or not at all, as a reaction product of the solid material sputtered off the sources with the reactive gas, also setting operating points which, without the provided regulation, could not be stabilized, i.e. operating points with which the sputtered target surface would be poisoned through said poorly conducting or non-conducting reaction products in such a way that the coating process, if it did not come to a complete stop would, nevertheless, become uncontrollable through so-called "arcing".

Furthermore, preferably between each cathode sputtering source 1 and the motion path of the workpiece carrier arrangement 49, a controllably movable shielding 74 is provided, for example running in upper and lower guides. By means of a drive 76 each shielding 74 is inserted or removed from between target surface and gas outlet tubing 33, on the one hand, and workpiece carrier 49, on the other hand, in order to expose subsequently the appropriate workpieces to the cathode sputtering.

The described method and the preferably employed apparatus is especially suited for coating workpieces, such as tools, with a mechanically resistant layer, in particular comprising titanium nitride, or with another layer known as mechanically resistant layers, such as a nitride, carbide or oxinitride layer or a mixed form thereof comprising tantalum, titanium, hafnium, zirconium or aluminum. As solid material is preferably sputtered the metal phase, such as titanium but it is readily possible to cathode-sputter a sub-nitride, oxide or carbide compound.

The approach with an apparatus as depicted in conjunction with FIGS. 4 and 5 for coating drills, is explained in the following.

1. Heating

The vacuum receptacle 9 is evacuated to $2 \cdot 10^{-5}$ mbars. The workpiece carrier drive is set in motion and the hot cathode is heated with a heating current of 150 A. Via connection 11 argon is introduced to a pressure of $3 \times 10^{-3}$ mbars and, subsequently, the low-voltage arc discharge 3 is ignited. Its discharge current is adjusted to 60 A. Thereupon the argon pressure is reduced to $25 \times 10^{-4}$ mbars and the rotating workpieces are plasma-heated for approximately 12 minutes. With unit 67 the electric potential of the workpieces is set with respect, for example here, to the grounded receptacle wall.

2. Etching

The argon pressure in the receptacle is increased to $3 \times 10^{-3}$ mbars and with coils 47 the plasma beam of the discharge 3 is increasingly focused. The discharge current of the discharge 3 is about 70 A. By lowering the electric potential at the workpieces with source 67 to approximately −200 V, the ion acceleration voltage toward the workpieces is increased so that etching of the workpiece surface is initiated. During this etching process the diaphragms 74 are preferably closed so that in the central chamber part of the receptacle 9 the etching process is carried out while, simultaneously, the target surfaces of the cathode sputtering sources 1 can be sputtered free.

3. Coating

The argon pressure is increased to $18 \cdot 10^{-3}$ mbars, the discharge beam of the plasma discharge 3 is defocused by reducing the coil current in coils 47. The discharge current of the discharge 3 is further reduced to approximately 50 A. With the cathode sputtering sources 1 switched on, the shieldings 74 are pulled back and now the workpieces are exposed by rotation according to $\omega_{55}$ alternatingly to the particular cathode sputtering sources 1 and the central plasma beam of the further discharge 3.

With the method according to the invention and the apparatus according to the invention, mechanically resistant layers are produced which essentially meet the same requirements as layers produced in ion plating.

According to the approach described under 3. coating, with an apparatus according to FIG. 5, 6 mm drills comprising high-speed steel HSS were coated with TiN. The rotational speed $\omega_{55}$ of the 16 provided trees in the apparatus according to FIG. 5 was approximately 0.1 Hz.

In the following Table the drill test results at varying coating process parameters are summarized as "number of holes" As the drill test was used a standard test for the quality assurance. The "hole number" specification, consequently, is a relative measure of the quality of the drills.

| Trial | Plasma beam current density | Magnetic field, coil | Substrate voltage | Sputtering power (3 sputtering sources) | Substrate current | Substrate temperature | Performan. in drill test (hole number) |
|---|---|---|---|---|---|---|---|
| 1 | 90 A | 0 A | −200 V | 3*8 kW | 8 A | 310° C. | 49 |
| 2 | 70 A | 5 A | −200 V | 3*8 kW | 7 A | 300° C. | 62 |
| 3 | 40 A | 5 A | −200 V | 3*8 kW | 5.9 A | 280° C. | 57 |
| 4 | 40 A | 5 A | −150 V | 3*8 kW | 5.5 A | 250° C. | 55 |
| 5 | 30 A | 10 A | −150 V | 3*8 kW | 6 A | 285° C. | 52 |
| 6 | 30 A | 5 A | −150 V | 3*8 kW | 4.8 A | 230° C. | 50 |
| 7 | 30 A | 0 A | −150 V | 3*8 kW | 3 A | 230° C. | 30 |
| 8 | 0 | 0 | −200 V | 3*8 kW | 2 A | 225° C. | 5 |
| 9 | 30 A | 5 A | −150 V | 3*12 kW | 5.0 A | 235° C. | 10 |
| 10 | 45 A | 5 A | −150 V | 3*12 kW | 7.6 A | 305° C. | 23 |

Comments on the Experiments shown in the Table

No. 1

Sputtering with low-voltage center discharge (NZE) at an arc current of 90 A. Substrate current 4 times higher than No. 8. Thereby higher substrate temperature (310° C.). The high center plasma density at the workpieces leads to golden, shining and compact layers. The performance during the drill test is considerably better than for example in the case of No. 8.

No. 2 and 3

Sputtering with lower NZE plasma beam current density. The ion bombardment on the workpieces and, consequently, the substrate temperature are lower. But the layers are still compact and shining. The performance in the drill test is even better than with No. 1.

No. 4

Lowering the coating temperature through low substrate voltage, without marked decrease of the drill performance.

No. 5

With increased coil current (10 A) the degree of ionization of the argon is higher and with it the NZE plasma density on the substrates (substrate current). The drill performance is slightly better, but the temperature is markedly higher in comparison to charge No. 6.

No. 6

Lowest coating temperature with good drilling results. Optimum combination of magnetic field and arc current. The layers are compact and golden.

No. 7

Practically without coil current the NZE plasma density on the samples is insufficient, which causes a coarser layer structure and a deterioration of the drill performance.

No. 8

Purely reactive sputtering (without low-voltage center discharge). Lowest achievable temperature (with 3×8 kW) but drilling results comparable with those of uncoated drills. Matt and brown layers with coarse, stalk-like structure.

No. 9

With a sputtering power of 12 kW the deposition rate is significantly higher. But with the parameters of charge No. 6, the plasma density at the workpieces is too low to ensure a sufficient ion bombardment by Ar ions. The layers are less compact and the drilling performance is significantly worse.

No. 10

Only with an NZE plasma beam current density of 45 A at a sputtering power of 3×12 kW is the Ar ion bombardment sufficient to permit the deposition of compact layers. The drilling performance is better but the temperature is above 300° C.

We claim:

1. A method for depositing a layer on a surface of a workpiece to be coated, comprising:

establishing a reactive gas atmosphere;

cathode sputtering a solid material phase using a sputtering plasma discharge in the reactive gas atmosphere;

depositing a layer on the surface of the workpiece to be coated, the layer comprising the reaction product of solid material sputtered from the solid material phase, and reactive gas from the reactive gas atmosphere;

establishing a substantially non-reactive gas atmosphere;

generating in the substantially non-reactive gas atmosphere, at least one further plasma discharge in addition to the sputtering plasma discharge;

repeatedly and cyclically exposing the surface of the workpiece to be coated, at repeated times, to the cathode sputtering in the reactive gas atmosphere, and at repeated different times to the further plasma discharge in the substantially non-reactive gas atmosphere, said further plasma discharge causing substantially no solid material to be deposited on the surface of the workpiece to be coated, and the surface of the workpiece being exposed to the cathode sputtering a plurality of said times and the surface of the workpiece being exposed to the further plasma discharge a plurality of said different times.

2. Method as stated in claim 1 wherein the alternating exposing takes place through a pivot ($\omega_2$) or rotation motion ($\omega_1$) of the workpiece (7, 7a).

3. Method as stated in claim 1, wherein facing the further plasma discharge a tangential plane (E) on the surface to be coated is essentially in its central region essentially parallel to a tangent on the discharge path (P) of the further discharge (3).

4. Method as stated in claim 1, wherein at least two spatially separated cathode sputtering processes are carried out and the workpiece (7).

5. Method as stated in claim 4, characterized in that the reactive gas is introduced (33) into the immediate proximity of the cathode sputtering processes (1).

6. Method as stated in claim 4, including supplying a reactive gas mass stream of a reactive gas to each of the spatially separated cathode sputtering processes, each of the reactive gas mass streams being individually regulated (75).

7. Method as stated in claim 1, wherein the workpiece is cyclically exposed to the cathode sputtering processes in a circling motion.

8. Method as stated in claim 1, wherein the further plasma discharge (3) which is implemented is selected from the group consisting of an arc and focused discharge.

9. Method as stated in claim 8, wherein the arc is a low-voltage arc.

10. Method as stated in claim 9, wherein at least one of a focusing and a discharge power of the arc is adjusted.

11. Method as stated in claim 1, wherein further plasma discharge is essentially a discharge in a noble gas.

12. Method as stated in claim 1, wherein the workpiece is placed at an electric potential which is more negative than a plasma potential of the further plasma discharge.

13. Method as stated in claim 12, wherein said electric potential is selected from the group consisting of:

an electric potential which is more negative than +10V;

an electric potential which is +5V at maximum;

an electric potential which is -5V at maximum;

an electric potential which is between -5V and -300V; and an electric potential of approximately -150V.

14. Method as stated in claim 1, wherein the exposing of the surface of the workpiece takes place at a maximum frequency of 30 Hz.

15. Method as stated in claim 14, wherein the maximum frequency is selected from the group consisting of: 10 Hz at most; under 1 Hz; and approximately 0.1 Hz.

16. Method as stated in claim 1, wherein an electric potential on the workpiece (7) is adjusted.

17. Method as stated in claim 1, wherein a mass stream of the atmosphere reactive gas, introduced into an immediate proximity of the sputtering plasma discharge, is regulated and as the sensor for the regulating variable (X) a plasma emission measuring head (70) is provided in the immediate proximity of the sputtering plasma discharge, and specifically so that with respect to the light radiation from the further plasma discharge (3) it is essentially protected (72).

18. Method as stated in claim 1, wherein the workpiece temperature is kept below 300° C.

19. Method as stated in claim 18, wherein the workpiece temperature is at a maximum of 250° C.

20. Method as stated in claim 1, wherein the cathode sputtering source utilizes a magnetron.

21. Method as stated in claim 1, wherein said surface is treated, when exposed to said further plasma discharge, by ion bombardment.

22. Method as stated in claim 1, wherein a mass stream of the reactive gas in the reactive gas atmosphere is regulated.

23. Method as stated in claim 22, including at least one plasma emission monitor acting as a sensor for the reactive gas atmosphere and used to control means for regulating the mass stream of reactive gas.

24. Method as stated in claim 1, wherein the workpiece is controllably shielded against the solid material phase of the cathode sputtering.

25. Method as stated in claim 1, wherein, by at least one of changing a plasma density of the further plasma discharge at a site of the workpiece surface exposed to the further plasma discharge and changing an electric potential applied to the workpiece, the surface exposed to said further plasma discharge is one of etched and heated.

26. Method as stated in claim 1, wherein the layer deposited on the workpiece is a mechanically resistant material layer selected from the group consisting of carbides, nitrides and oxynitrides, and wherein the workpiece is a tool.

27. Method as stated in claim 1, wherein the workpiece is a tool.

28. Method as stated in claim 1, wherein the workpiece is a twist drill.

29. Method as stated in claim 1, wherein the layer deposited on the workpiece is a layer selected from the group consisting of carbides, nitrides and oxynitrides of titanium, tantalum, zirconium, hafnium and aluminum.

30. A coating apparatus with a vacuum receptacle having a cylindrical inner wall, the apparatus comprising:

a plurality of cathode sputtering sources with respective plasma discharge paths arranged along a coaxial circle along said cylindrical inner wall;

a reactive gas feed to said cathode sputtering sources;

a further plasma discharge path extending centrally along an axis of a cylinder formed by said cylindrical inner wall and being operatable simultaneously with said sputtering sources;

at least one further gas feed from a non-reactive gas source to said further plasma discharge path, said further plasma discharge path not acting on a solid material source to free solid coating material;

a plurality of workpiece carrier turrets with axes parallel to said further plasma discharge path and arranged between said further plasma discharge path and said inner wall and carrying workpiece carriers remote from said respective axes; and drive means connected to said workpiece carrier turrets for rotating said turrets around their axes for repeatedly and cyclically exposing workpieces at said workpiece carriers alternatingly to said cathode sputtering sources and to said further plasma discharge path, said drive means being operative so that said workpiece carrier turrets are additionally and simultaneously rotatably driven around said further plasma discharge path and along said cathode sputtering sources so as to homogenize an effect of said cathode sputtering sources and of said further plasma discharge path with respect to said workpieces as said workpiece carriers rotate around said turret axes.

31. Apparatus as stated in claim 30, characterized in that the cathode sputtering sources are each a magnetron sputtering source.

32. Apparatus as stated in claim 30, characterized in that a control system (19, 21, 17) is provided for the quantity of gas introduced through the reactive gas feed (13).

33. Apparatus as stated in claim 32, including a plasma emission monitor sensor head for sensing a regulating variable for introduction of the quantity of gas which is the reactive gas.

34. Apparatus as stated in claim 30, characterized in that controllable shieldings (74) are provided between cathode sputtering sources (1) and workpiece carriers (49).

35. Apparatus as stated in claim 30, characterized in that the workpiece carrier turrets are connected with an electric source (67) for the controlled application of potential.

36. Apparatus of claim 30, comprising a negative feedback control system for one cathode sputtering source with a final control element for the reactive gas feed.

37. Apparatus of claim 30, further comprising a negative feedback control system for each cathode sputtering source with a plasma emission monitor adjacent said cathode sputtering source.

38. Apparatus of claim 37, characterized in that plasma emission monitor is shielded against light radiation from said further plasma discharge path.

39. Apparatus according to claim 30, characterized in that the further plasma discharge path is one of a plasma beam discharge path and of a plasma arc discharge path.

40. Apparatus as stated in claim 39, characterized in that the further plasma discharge path (3) comprises an ionization chamber (35) with hot cathode (41) and exit diaphragm (37).

41. Apparatus as stated in claim 39, characterized in that controllable magnetic field generating means (47) are provided in order to control the focusing of the plasma beam (3).

42. Apparatus as stated in claim 30, characterized in that the further gas inlet communicates with a noble gas reservoir.

43. Apparatus as stated in claim 30, characterized in that portions provided for contacting workpieces on the workpiece carrier arrangement are connected to a DC source which brings the portions to an electrical potential which is selected from the group consisting of: no more negative than +10V at a maximum of +5V, at a maximum of −5V, between −5V and −300V and approximately −150° V.

44. Apparatus according to claim 30, wherein the coating is made of a mechanically resistant material and the workpiece is selected from the group consisting of tools and drills which are made of material selected from the group consisting of carbide, nitride and oxynitride layers made from the group consisting of titanium, tantalum, hafnium, zirconium and aluminum, and mixtures of the carbide, nitride and oxynitride layers.

\* \* \* \* \*